(12) United States Patent
Nanataki et al.

(10) Patent No.: US 7,247,972 B2
(45) Date of Patent: Jul. 24, 2007

(54) DIAPHRAGM STRUCTURE

(75) Inventors: Tsutomu Nanataki, Toyoake (JP); Kunihiko Yoshioka, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 11/315,895

(22) Filed: Dec. 22, 2005

(65) Prior Publication Data

US 2006/0175933 A1 Aug. 10, 2006

(30) Foreign Application Priority Data

Dec. 22, 2004 (JP) ............................. 2004-372133

(51) Int. Cl.
H02N 2/00 (2006.01)
H01L 41/00 (2006.01)
B41J 2/16 (2006.01)

(52) U.S. Cl. .................... 310/324; 347/27; 347/48; 347/68; 347/72

(58) Field of Classification Search ............... 310/324; 347/27, 48, 68–72
See application file for complete search history.

(56) References Cited

U.S. PATENT DOCUMENTS

| 5,157,420 | A | * | 10/1992 | Naka et al. .................... 347/71 |
| 5,210,455 | A | | 5/1993 | Takeuchi et al. |
| 5,376,856 | A | * | 12/1994 | Takeuchi et al. ............. 310/328 |
| 5,545,461 | A | | 8/1996 | Takeuchi et al. |
| 5,592,042 | A | | 1/1997 | Takuchi et al. |
| 5,622,748 | A | | 4/1997 | Takeuchi et al. |
| 5,631,040 | A | | 5/1997 | Takuchi et al. |
| 5,681,410 | A | | 10/1997 | Takeuchi et al. |
| 5,691,593 | A | | 11/1997 | Takeuchi et al. |
| 5,889,351 | A | | 3/1999 | Okumura et al. |
| 5,965,970 | A | | 10/1999 | Takeuchi et al. |
| 6,049,158 | A | | 4/2000 | Takeuchi et al. |
| 6,108,880 | A | | 8/2000 | Takeuchi et al. |
| 6,348,115 | B1 | | 2/2002 | Takeuchi et al. |
| 6,441,537 | B1 | | 8/2002 | Takeuchi et al. |
| 6,830,325 | B2 | * | 12/2004 | Hirota et al. .................. 347/71 |

FOREIGN PATENT DOCUMENTS

| JP | 03-128681 | 5/1991 |
| JP | 05-049270 | 2/1993 |
| JP | 08-051241 | 2/1996 |
| JP | 08-201265 | 8/1996 |
| JP | 8-304199 | 11/1996 |
| JP | 3313531 | 5/2002 |
| JP | 2002-331671 | 11/2002 |
| JP | 2003-152236 | 5/2003 |

* cited by examiner

Primary Examiner—Darren E Schuberg
Assistant Examiner—J. Aguirrechea
(74) Attorney, Agent, or Firm—Burr & Brown

(57) ABSTRACT

There is disclosed a diaphragm structure that includes: a ceramic substrate 3 in which at least one opening 2 is formed, and a thin diaphragm portion 4 having a shape protruding on a side opposite to the opening 2 and constituted of a ceramic fired integrally with the ceramic substrate 3 in such a manner as to cover the opening 2. An opening shape of the opening 2 is a shape including at least one tip portion 5 in a longitudinal direction, having a curved shape, and a tapered portion 6 whose opening width gradually narrows toward the tip portion 5 and which is constituted of a curve or a straight line, and a portion of the diaphragm portion 4 corresponding to the tapered portion 6 has such a shape that a protruding height gradually lowers toward the tip portion 5.

3 Claims, 5 Drawing Sheets

DIAPHRAGM STRUCTURE

This application claims the benefit of Japanese Application 2004-372133, filed Dec. 22, 2004, the entirety of which is incorporated herein by reference.

1. Technical Field

The present invention relates to a diaphragm structure, more particularly to a diaphragm structure in which defects such as minute cracks are not easily generated in a thin portion even in the case where heating and loading are performed in order to eliminate a warpage, a distortion or the like or the case where the diaphragm structure is used in a situation in which a diaphragm portion is loaded and which is suitable as a substrate for constituting a piezoelectric/electrostrictive element.

2. Background Art

In recent years, there has been a demand for a displacement element which adjusts an optical path length or a position of the order of sub-microns, or a detection element which detects a minute displacement as an electric change in fields of optics, precise working and the like. To meet this demand, there is being developed a piezoelectric/electrostrictive element (piezoelectric/electrostrictive device) for use in an actuator or a sensor, which is an element utilizing a revealing phenomenon of the displacement based on a converse piezoelectric effect generated when an electric field is applied to a piezoelectric material of a ferroelectric body or the like, or a reverse phenomenon.

As such piezoelectric/electrostrictive device, there is disclosed, for example, a device for use in measuring properties such as fluid density, concentration, and viscosity (see, e.g., Patent Document 1). Such piezoelectric/electrostrictive device is used as the sensor by utilizing a correlation which is present between an amplitude of the piezoelectric/electrostrictive device as a vibrator and a viscous resistance of a fluid brought into contact with the piezoelectric/electrostrictive device (vibrator).

As a related conventional technology, there is disclosed a piezoelectric/electrostrictive film type element (actuator) comprising: a ceramic substrate having at least one window portion, and at least one thin wall portion formed by integrally disposing a thin diaphragm portion in such a manner as to cover this window portion; and a piezoelectric/electrostrictive operating portion formed by combining a lower electrode, a piezoelectric/electrostrictive layer, and an upper electrode, and integrally laminated on an outer surface of the diaphragm portion of this ceramic substrate (see, e.g., Patent Document 2 and Patent Document 3).

Moreover, in order to enhance a rigidity of the diaphragm portion, accordingly enhance a response speed, and convert a distortion or a stress generated in the piezoelectric/electrostrictive operating portion into a displacement with good efficiency, as shown in FIGS. 3 and 4, there is disclosed a diaphragm structure 10 comprising: a ceramic substrate 3 in which openings 2 are formed; and a ceramic-made thin diaphragm portion 4 having a shape protruding on a side opposite to the openings 2, and fired integrally with the ceramic substrate 3 in such a manner as to cover the openings 2 (see, e.g., Patent Document 4).

Here, since the diaphragm structure is made of the ceramic, the structure is manufactured by the firing. Therefore, in general, a slight warpage, distortion or the like is generated in the fired diaphragm structure. Therefore, as shown in FIG. 5, a fired diaphragm structure 20 is sandwiched in a vertical direction between sandwiching members 9 constituted of upper and lower sandwiching members 9a and 9b. The structure is heated and loaded on appropriate conditions to thereby eliminate the warpage, the distortion or the like caused by the firing.

However, in the case where the diaphragm structure 20 is heated and loaded in order to eliminate the warpage, the distortion or the like, there is a problem that defects such as minute cracks are easily generated in the diaphragm portion 4 (thin portion). On the other hand, there is a case where the warpage, the distortion or the like cannot be sufficiently eliminated on heating and loading conditions to such an extent that any defect is not generated in the diaphragm portion 4. Furthermore, in the case where a plurality of openings 2 are disposed, and the warpage, the distortion or the like cannot be sufficiently eliminated, protruding height of the diaphragm portion 4 sometimes becomes nonuniform. There is a problem that such diaphragm structure 20 having uneven protruding height of the diaphragm portion 4 is not appropriate as a substrate for constituting the piezoelectric/electrostrictive element whose displacement is required to be adjusted with high precision in some case. In order to obtain an element assembly having little fluctuation of the displacement for each element, it is important to obtain a uniform protruding height of the diaphragm portion 4.

[PATENT DOCUMENT 1]
Japanese Patent Application Laid-Open No. 8-201265
[PATENT DOCUMENT 2]
Japanese Patent Application Laid-Open No. 3-128681
[PATENT DOCUMENT 3]
Japanese Patent Application Laid-Open No. 5-49270
[PATENT DOCUMENT 4]
Japanese Patent No. 3313531

SUMMARY OF THE INVENTION

The present invention has been developed in view of such problem of the conventional technology and aims to provide a diaphragm structure in which defects such as minute cracks are not easily generated in a thin portion even in the case where the structure is heated and loaded in order to eliminate a warpage, a distortion or the like and which is suitable as a substrate for constituting a piezoelectric/electrostrictive element.

As a result of intensive investigation for achieving the above-described aim, the present inventors have found that, in a case where the diaphragm structure is heated and loaded, defects such as minute cracks generated in the thin portion are concentrated on a spherical tip portion corresponding to an opening in a longitudinal direction, rigidity of this portion is high, and stress upon heating and loading is easily concentrated on the portion. Therefore, the present inventors have found that the above-described aim can be achieved by forming the opening in such a manner that an opening shape has a so-called tapered portion, and forming a diaphragm portion corresponding to this tapered portion in such a manner that protruding height gradually lowers toward the tip portion, and they have completed the present invention.

That is, according to the present invention, the following diaphragm structure is provided.

[1] A diaphragm structure comprising a ceramic substrate in which at least one opening is formed, and a thin diaphragm portion having a shape protruding on a side opposite to the opening and constituted of a ceramic integrally fired with the ceramic substrate in such a manner as to cover the opening; wherein an opening shape of the opening is a shape including at least one tip portion in a longitudinal direction having a curved shape, and a tapered portion whose opening width is gradually reduced toward the tip portion and which is constituted of a curve or a straight line, and a portion of the diaphragm portion corresponding to the tapered portion has such a shape that protruding height gradually lowers toward the tip portion.

[2] The diaphragm structure according to the paragraph [1], wherein a length of the tapered portion is 15% or more of a maximum opening width, and the curved shape of the tip portion is any one of a circular arc shape, a semicircular arc shape, an elliptic arc shape, and a curved shape having a straight line portion in a portion other than a portion connected to the tapered portion, and a diameter of the tip portion is in a range of 40 to 90% of the maximum opening width in the case where the curved shape of the tip portion is the circular arc shape.

[3] The diaphragm structure according to the paragraph [1], wherein a length of the tapered portion is 50% or more of a maximum opening width, and the curved shape of the tip portion is any one of a circular arc shape, a semicircular arc shape, an elliptic arc shape, and a curved shape having a straight line portion in a portion other than a portion connected to the tapered portion, and a diameter of the tip portion is in a range of 40 to 90% of the maximum opening width in the case where the curved shape of the tip portion is the circular arc shape.

The diaphragm structure of the present invention exhibits an effect that defects such as the minute cracks are not easily generated in the thin portion even in the case where the structure is heated and loaded in order to eliminate the warpage, the distortion or the like and that the structure is suitable as the substrate for constituting the piezoelectric/electrostrictive element.

EXPLANATION OF SYMBOLS 1, 10, 20: diaphragm structure, 2: opening, 3: ceramic substrate, 4: diaphragm portion, 5: tip portion, 6: tapered portion, 7: straight line portion, 8: cavity, 9a: upper sandwiching member, 9b: lower sandwiching member, 9: sandwiching member, 15: ceramic green substrate, 17, line contained in tip portion, 18: portion connected to the tapered portion, 25, 35: base substrate, 26, 31: ceramic green sheet, 27: laminate, 30: hole portion, 45: stepped portion, 50: piezoelectric/electrostrictive element assembly, 55a: lower electrode layer, 55b: upper electrode layer, 60: piezoelectric/electrostrictive layer, 65: piezoelectric/electrostrictive actuation portion, W: maximum opening width, H: protruding height, $H_1$: protruding height of the tip portion of the tapered portion, $H_2$: maximum protruding height, $L_1$: tapered portion length, $L_2$: straight line portion length, D: diameter of the tip portion, $D_1$: tip opening width

BEST MODE FOR CARRYING OUT THE INVENTION

The best mode for carrying out the present invention will be described hereinafter, but it should be understood that the present invention is not limited to the following embodiment, and the scope of the present invention includes even the following embodiment subjected to appropriate change, improvement or the like based on ordinary knowledge of a person skilled in the art in a range without deviating from the scope of the present invention.

Figure 1:
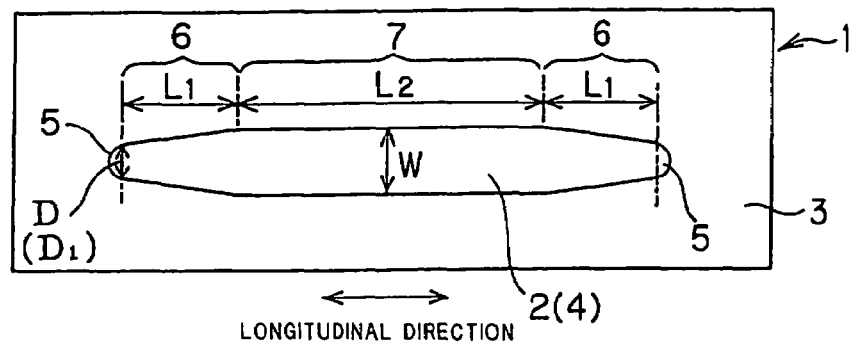
FIG. 1 is a top plan view schematically showing one embodiment of a diaphragm structure of the present invention.
Figure 2:
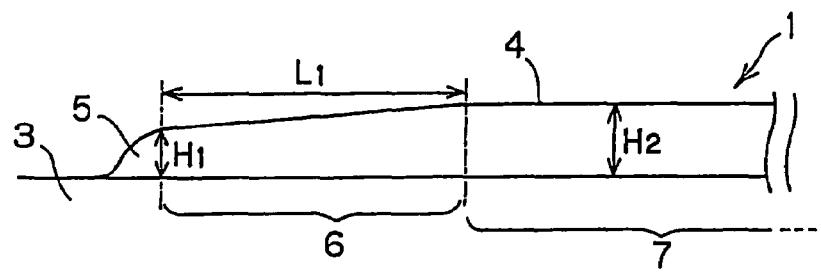
FIG. 2 is a partially enlarged sectional view schematically showing one embodiment of the diaphragm structure of the present invention.

FIG. 1 is a top plan view schematically showing one embodiment of a diaphragm structure of the present invention. FIG. 2 is a partially enlarged sectional view schematically showing one embodiment of the diaphragm structure of the present invention. As shown in FIGS. 1 and 2, a diaphragm structure 1 of the present embodiment is provided with a ceramic substrate 3 in which an opening 2 is formed and a thin diaphragm portion 4 having a shape protruding on a side opposite to the opening 2 and constituted of a ceramic integrally fired with the ceramic substrate 3 in such a manner as to cover the opening 2. It is to be noted that FIG. 1 shows a state in which one opening 2 is formed, but the number of openings is not especially limited, and a plurality of openings may be formed.

As to an opening shape of the opening 2 of the diaphragm structure 1 of the present embodiment, a tip portion 5 of the opening in a longitudinal direction has a circular arc shape, and the opening has a shape including a so-called tapered portion 6 whose opening width is gradually reduced toward the tip portion 5 and which is constituted of a curve or a straight line. A portion of the diaphragm portion 4 corresponding to the tapered portion 6 has such a shape that protruding height gradually lowers toward the tip portion 5.

There is assumed the case where the diaphragm structure 1 of the present embodiment having such a structural characteristic is sandwiched between sandwiching members in a vertical direction, and the structure is heated and loaded on appropriate conditions to thereby eliminate a warpage, a distortion or the like generated by firing. In the diaphragm structure 1 of the present embodiment, the portion of the diaphragm portion 4 corresponding to the tapered portion 6 has such a shape that the protruding height gradually lowers toward the tip portion 5. Therefore, even in the case where the shape is corrected as described above, a stress upon heating and loading is directly applied to a straight line portion 7 of the diaphragm portion 4 and a portion of the tapered portion 6 having a great protruding height, and any stress is not concentrated on the tip portion 5 corresponding to the opening 2 in the longitudinal direction, on which the stress is easily concentrated most. Therefore, in the diaphragm structure 1 of the present embodiment, defects such as minute cracks are not easily generated in a thin portion (diaphragm portion 4) even in the case where the structure is sandwiched between the sandwiching members in the vertical direction and heated and loaded on the appropriate conditions.

Moreover, there is assumed a case where a plurality of openings 2 are formed. In this case, since defects such as the cracks are not easily generated in the diaphragm portion 4, the diaphragm structure 1 of the present embodiment can sufficiently be heated and loaded to such an extent that the warpage, the distortion or the like generated upon firing can be eliminated. Therefore, in the diaphragm structure of the present embodiment, the protruding height of the diaphragm portion can be uniformed for each of cavities formed by a plurality of diaphragm portions 4. The structure is suitable as a substrate for constituting a piezoelectric/electrostrictive element whose displacement is required to be adjusted with high precision or as a member for a sensor.

A tapered portion length $L_1$ of the diaphragm structure 1 is preferably 15% or more. As a result, the stress upon heating and loading caused by contact with the upper sandwiching member 9a would not directly loaded on the tip portion. In addition, in case that the tapered portion length $L_1$ is 15% or more of the maximum opening width W, the stress upon heating and loading tends to be easily loaded on the tip portion.

Moreover, a tapered portion length $L_1$ of the diaphragm structure 1 is more preferably 50% or more, further preferably 100% or more of the maximum opening width W. When the tapered portion length $L_1$ is less than 50% of the maximum opening width W, the tip portion 5 tends to be easily charged with the stress upon heating and loading. When the tapered portion length $L_1$ is more than 50% of the maximum opening width W, the defects caused by the stress upon heating and loading are hard to be generated. This is considered to be caused by the following reason. The stress generated by loading on the straight line portion and protruding high position of the tapered portion is buffered by the deformation of the tapered portion, and the stress is hard to reach the tip portion 5 due to the position of the tip portion being sufficiently apart from the straight line portion 7. When the tapered portion length $L_1$ is more than 100%, load buffering effect on the tip portion 5 can be obtained even in the case where the load is large. It is to be noted that, though there is not any special restriction on the upper limit of a ratio of the tapered portion length $L_1$, the ratio is preferably 50% or less (i.e., "$L_1/\{(2L_1+L_2)/2\} \times 100 \leq 50$") of an opening half length $((2L_1+L_2)/2)$. When the ratio exceeds 50%, the displacement is excessively reduced at a time when the structure is driven as an actuator or a sensor, an output or an output signal is reduced, and properties of the element tend to drop.

Here, the "opening width" mentioned in the present specification refers to an opening dimension of the opening in a short direction, and the "maximum opening width" refers to an opening width that is the largest of all the opening widths of portions of the opening. The "protruding height" refers to a distance between a line segment connecting opposite end portions of a diaphragm to each other and a central point of the diaphragm in a plane including a normal to a surface in which the opening is formed, and an opening width direction. Moreover, in one diaphragm, the broader the corresponding opening width is, the higher the protruding height is. Therefore, in the case where there is a straight line portion in the opening, the protruding height of the diaphragm portion corresponding to the straight line portion is the "maximum protruding height" of the diaphragm structure. The "straight line portion of the opening" refers to a portion having a substantially equal opening width.

In addition, the "tapered portion" mentioned in the present specification refers to a portion gradually reducing protruding height of the diaphragm 4 due to the gradual reduction of the opening width from the maximum opening width W (ref. FIG. 1). And the "tip portion" refers to a portion drastically reducing the protruding height of the diaphragm 4 due to the rapid reduction of the opening width in order to connect right and left edge of the opening 2 (ref. FIG. 1). Accordingly, for example, there are cases like "The tapered portion 6 is straight line (However at the site connecting with straight line 7 has a curved line.) and the tip portion 5 is circular arc shaped.", and "Both the tapered portion 6 and the tip portion 5 are circular arc shaped and curvature of the tapered portion 6 is smaller than that of the tip portion 5." and so on.

The tip portion of the diaphragm keeps spherical shape with high rigidity, if the piezoelectric/electrostrictive element is formed by using the conventional diaphragm structure. Therefore, the spherical tip portion is hardly displaced. However, the spherical tip portion becomes smaller than the spherical tip portion formed by using the conventional diaphragm structure, if the piezoelectric/electrostrictive element is formed by using the diaphragm structure 1 of this embodiment. Accordingly, if the total length of the piezoelectric/electrostrictive element is identical, the ratio of the part which is not displaced becomes shorter than the ratio using the conventional diaphragm structure. Namely, when the diaphragm structure of this embodiment is used, the piezoelectric/electrostrictive element having high ratio of the length of displaceable portion in a longitudinal direction can be produced without defects such as cracks. When the piezoelectric/electrostrictive element having high ratio of the length of displaceable portion in this manner is used for sensor, there is an advantage for signal intensity. In addition, the displaceable volume of the diaphragm 4 of the tapered portion 6 is smaller than the displaceable volume of the diaphragm 4 of the straight line portion 7. However, in the case that advantage for above described effect of the increase in displaceable portion length is larger than disadvantage for the volume reduction of the displaceable portion, to apply such piezoelectric/electrostrictive element for use in discharging liquids induced inside cavity is advantageous in larger volume of exclusion.

Moreover, FIG. 1 shows the case where the tip portion 5 of the opening 2 has a circular arc shape. However, the shape is not limited to such a shape in the present invention. The shape of the tip portion 5 is preferably set to be, for example, a semicircular arc shape, an elliptic arc shape, a curved shape having a straight line portion in a portion other than a portion connected to the tapered portion or the like in addition to the circular arc shape shown in FIG. 1. In the case where the tip portion 5 of the diaphragm structure 1 has the circular arc shape, a diameter D is preferably 40 to 90%, more preferably 50 to 80% of the maximum opening width W. When the diameter D of the tip portion 5 is less than 40% of the maximum opening width W, a stress is concentrated on the tip portion 5 upon firing shrinkage, and the tip portion tends to be cracked. On the other hand, when the diameter exceeds 90%, a protruding height $H_1$ of the tapered tip portion does not excessively lower, and an effect that defects such as the minute cracks are not easily generated in the thin portion tends to be hardly exhibited. When the diameter is 50 to 80%, the effect in relieving the load from the tip portion 5 is sufficient even in the case where the load is large.

Additionally, in FIG. 1, the tip portion 5 is circular arc shape, and diameter of the tip portion 5 is noted as "tip portion diameter D". However, when the tip portion is not circular arc shape, the concept "tip opening width $D_1$" can be noted. This "tip opening width $D_1$" refers to the width of the portion which is connected to tapered portion 6 on the tip portion 5.

It is to be noted that there is assumed a case where the diaphragm structure 1 of the present embodiment is used as a substrate constituting the piezoelectric/electrostrictive element (actuator). In order to obtain a preferable displacement, a thickness of the diaphragm portion 4 is preferably 1.5 to 20 μm, more preferably 2 to 12 μm. From a similar viewpoint, the maximum opening width W of the opening 2 is preferably 100 to 400 μm, more preferably 110 to 300 μm. Similarly, a straight line portion length $L_2$ is preferably 200 to 5000, more preferably 500 to 2000. From the viewpoint of mechanical strength, the ceramic constituting the diaphragm portion 4 has an average crystal particle diameter of preferably 1 μm or less, more preferably 0.6 μm or less.

Figure 7:
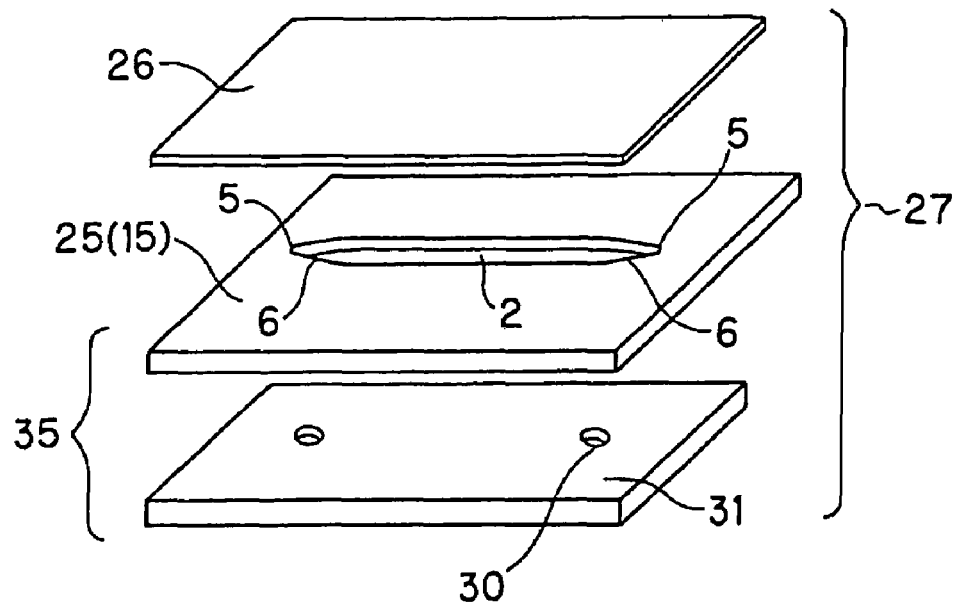
FIG. 7 is a perspective view schematically showing a part of a process of one embodiment of a method of manufacturing the diaphragm structure of the present invention.

Next, there will be described a method of manufacturing a diaphragm structure as the embodiment of the present invention. As shown in FIG. 7, to manufacture the diaphragm structure of the present embodiment, first, in a ceramic green substrate 15, at least one opening 2 is formed by a general working process such as punching to obtain a base substrate 25 in such a manner that the opening has a shape including at least one circular arc-shaped tip portion 5 in a longitudinal direction and a tapered portion 6 whose opening width is gradually reduced toward the tip portion 5.

Next, a ceramic green sheet 26 prepared in such a manner that properties satisfy the following equations (1) to (3) is laminated on one surface of the resultant base substrate 25 to obtain a laminate 27:

$$S(\text{substrate}) - S(\text{sheet}) \geq -0.08\{T_{70}(\text{substrate}) - T_{70}(\text{sheet})\} - 1 \quad (1);$$

$$0 \leq T_{70}(\text{substrate}) - T_{70}(\text{sheet}) \leq 300 \quad (2); \text{ and}$$

$$S(\text{substrate}) - S(\text{sheet}) \leq 20 \quad (3),$$

wherein S(substrate) and S(sheet) denote shrinkage percentages (%) of lengths in a planar direction in a case where the ceramic green substrate and the ceramic green sheet are fired alone at a temperature equal to the firing temperature of the laminate, respectively, and $T_{70}$(substrate) and $T_{70}$(sheet) denote temperatures (° C.) at which the shrinkage percentages reach 70% of those (S(substrate) and S(sheet)) of the ceramic green substrate and the ceramic green sheet, respectively.

The ceramics constituting the green substrate 15 and the ceramic green sheet 26 may be formed by laminating a plurality of ceramic green sheets, respectively. For example, as shown in FIG. 7, the ceramic green substrate 15 in which the opening 2 is formed can be laminated on a ceramic green sheet 31 in which appropriate hole portions 30 are formed to form a base substrate 35. It is to be noted that in a case where the structure is constituted in such a manner as to discharge a fluid from the hole portions 30, a channel sectional area gradually decreases toward tip portions 5. Therefore, a flow rate of the fluid discharged from the hole portions 30 can efficiently be raised, and a subtler amount of fluid can be discharged at a higher rate as compared with a conventional structure.

Moreover, there is no special restriction on a type of the ceramic constituting the ceramic green substrate 15 or the ceramic green sheet 26, and, for example, a stabilized zirconia material, a partially stabilized zirconia material, an alumina material, a mixed material of them or the like is preferably usable. Above all, the partially stabilized zirconia material is preferably used. The diaphragm structure 1 formed of such material exhibits high mechanical strength or toughness although the structure has a thin portion and fulfils properties such as low chemical reactivity with respect to a piezoelectric/electrostrictive material.

Thereafter, the resultant laminate 27 is fired. The firing temperature may be 1200 to 1700° C., and firing time may be one to six hours. The base substrate 35 can be fired integrally with the ceramic green sheet 26 by the firing. As a result, as shown in FIGS. 1 and 2, it is possible to obtain the diaphragm structure 1 provided with the ceramic substrate 3 having the opening 2 formed and the thin diaphragm portion 4 shaped in such a manner as to protrude on a side opposite to the opening 2 and constituted of the ceramic fired integrally with the ceramic substrate 3 in such a manner as to cover the opening 2. The portions of the diaphragm portion 4 corresponding to the tapered portions 6 are shaped in such a manner that the protruding height gradually lowers toward the tip portions 5.

According to the above-described method of manufacturing the diaphragm structure, even in a case where the structure is heated and loaded in such a manner as to eliminate the warpage, the distortion or the like, the diaphragm structure can be manufactured in which defects such as the minute cracks are not easily generated in the thin portion and which is suitable as the substrate constituting the piezoelectric/electrostrictive element. In a case where a plurality of diaphragm structures are arranged to form a diaphragm assembly, end portions of a bridging portions disposed between the diaphragm structures thicken. Therefore, rigidity of the bridging portions is enhanced. Therefore, the diaphragm assembly in which a plurality of diaphragm structures are more densely arranged can be easily manufactured.

Figure 9:
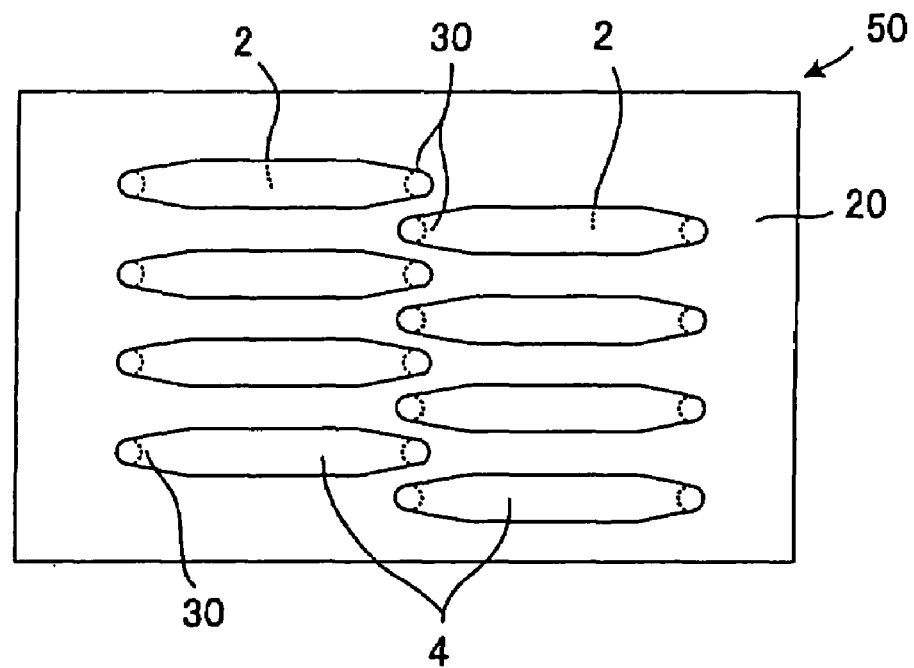
FIG. 9 is a top plan view showing an arrangement example of piezoelectric/electrostrictive element of the piezoelectric/electrostrictive element assembly using the diaphragm structure of the present invention.
Figure 10:
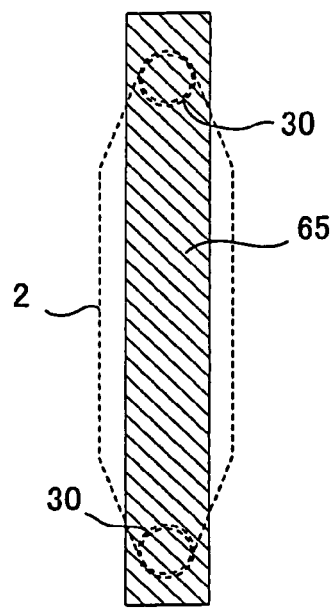
FIG. 10 is a top plan view showing a composition of piezoelectric/electrostrictive element constituting the piezoelectric/electrostrictive element assembly in FIG. 9.
Figure 11:
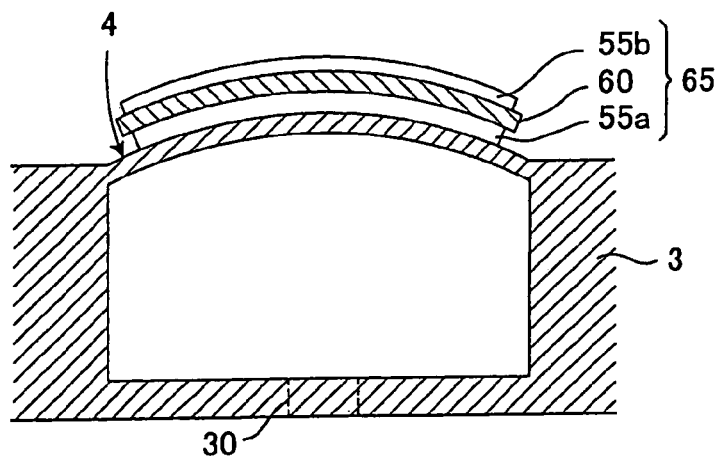
FIG. 11 is a sectional view showing a composition of piezoelectric/electrostrictive element constituting the piezoelectric/electrostrictive element assembly in FIG. 9.

FIG. 9 is a top plan view showing an arrangement example of piezoelectric/electrostrictive element of the piezoelectric/electrostrictive element assembly using the diaphragm structure of the present invention. FIG. 10 and FIG. 11 are top plan view and sectional view showing a composition of piezoelectric/electrostrictive element constituting the piezoelectric/electrostrictive element assembly in FIG. 9. A diaphragm structure 20 constituting a piezoelectric/electrostrictive element assembly 50 (actuator) can be produced by laminating and firing a plurality of ceramic green sheet as shown in FIG. 7 for example (ceramic green sheet 26 and 31, ceramic green substrate 15). In this diaphragm structure 20, the tip portions of adjacent openings 2 are positioned so as to alternately interdigitate. Therefore, this piezoelectric/electrostrictive element assembly 50 has as many diaphragms as possible in a limited area. Moreover, on the upper surface of the diaphragm 4, piezoelectric/electrostrictive actuation portion 65 formed by laminating lower electrode layer 55a, piezoelectric/electrostrictive layer 60 and upper electrode layer 55b in this order. Although it is not shown as an image, in the piezoelectric/electrostrictive actuation portion 65, the structure of the piezoelectric/electrostrictive layer 60 could be alternately multilayered by piezoelectric/electrostrictive material and electrode material in order to enhance electrical field intensity. At this time, the hole portions are formed in the position corresponding to the tip portions 5 of the diaphragm 4. Consequently, the hole portions 30 are positioned in substantially straight lines. Therefore, when this piezoelectric/electrostrictive element assembly 50 is used as, for example, an actuator for liquid discharging, high density liquid discharging is possible.

It is to be noted that, in the above-described method of manufacturing a diaphragm structure, details of a method of preparing the ceramic green substrate or sheet, a method of firing the laminate and the like are described in, for example, Japanese Patent Application Laid-Open Nos. 8-51238, 2000-91662, 2003-152236 and the like.

EXAMPLES

The present invention will be described hereinafter specifically based on examples. However, the present invention is not limited to these examples.

Example 1

Figure 6:
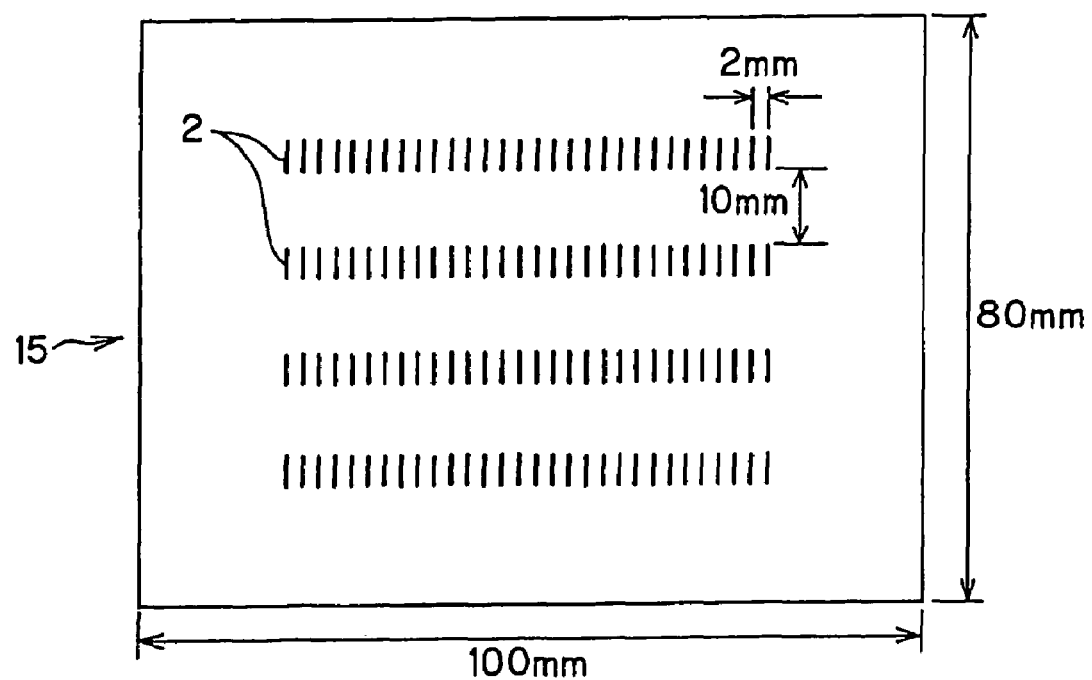
FIG. 6 is a schematic diagram showing an opening pattern of an opening.
Figure 8A:
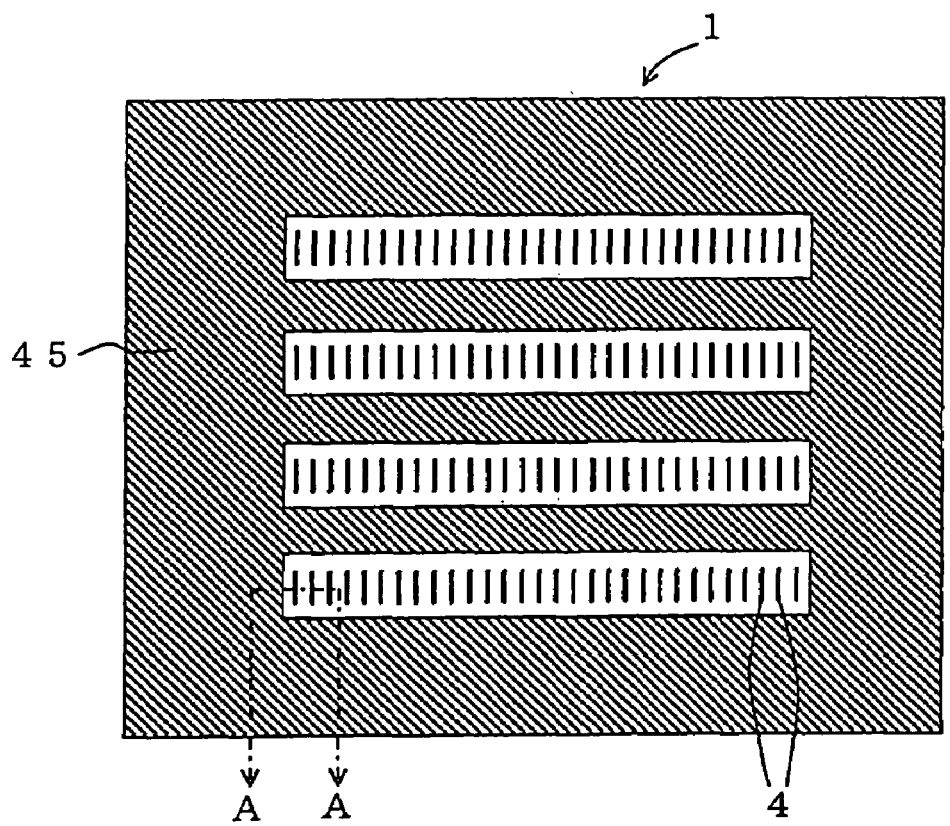
FIG. 8(a) is a top plan view schematically showing another embodiment of the diaphragm structure of the present invention.
Figure 8B:
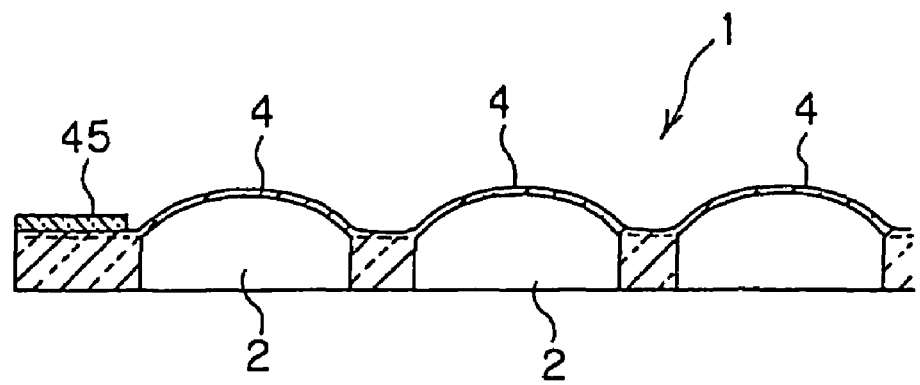
FIG. 8(b) is an A-A' sectional view of FIG. 8(a).

As shown in FIG. 6, openings 2 (30 openings×4 rows) having opening patterns were formed by mold press working in a ceramic green substrate 15 (zirconia green sheet) having an outer shape of 100×80 mm and a thickness of 100 µm. It is to be noted that dimensions and shapes of the openings 2 were set to a maximum opening width W=300 µm, a straight line portion length $L_2$=3000 µm, a tapered portion length $L_1$=600 µm, and a tip diameter D=160 µm (see FIG. 1). A thin zirconia green sheet having a thickness of 8 µm was laminated on two ceramic green substrates 15 provided with the openings 2 to obtain a laminate. Furthermore, a stepped portion was formed by screen printing on the surface of the laminate on a diaphragm portion protruding side between the diaphragm structures in such a manner that a height was 8.3 µm after sintering. It is to be noted that the zirconia green sheet was adjusted in such a manner as to satisfy the above equations (1) to (3). When this laminate was fired at 1500° C., the diaphragm structure 1 (see FIGS. 8(a) and 8(b)) was obtained in which the diaphragm portion 4 was shaped as shown in FIG. 2. It is to be noted that in FIGS. 8(a) and 8(b), reference numeral 45 denotes the stepped portion.

When a three-dimensional shape of the diaphragm structure obtained using a laser scanning microscope was measured, a maximum protruding height $H_2$ (see FIG. 2) was 10.2 to 12.1 µm, and a tapered tip portion protruding height $H_1$ was 7.5 to 9.0 µm.

Next, the diaphragm structure 1 was sandwiched between two upper and lower alumina blocks whose surfaces were smooth. The structure was loaded and thermally treated at 1400° C. for ten hours. It is to be noted that the alumina block laid on the diaphragm structure 1 has a mass of 500 g.

When the straight line portion protruding height $H_2$ (see FIG. 2) of each loaded and thermally treated diaphragm portion was measured with a contact type shape measurement device, the height was 8.7 to 9.2 µm. A red check penetrant was injected into each opening, and a cracking check of the diaphragm portion was conducted by confirmation of exuding onto the surface of the diaphragm portion. As a result of the check, a slight crack due to a factor such as dust was generated, but there was not generated any crack attributable to the loading thermal treatment only.

After appropriately forming and firing the lower electrode, the piezoelectric/electrostrictive portion, and the upper electrode by a screen printing process on the surface of the diaphragm portion of the diaphragm structure subjected to the loading and heating treatment, a polarization treatment was performed to thereby prepare a piezoelectric/electrostrictive element (actuator). A displacement of the diaphragm portion in a case where a voltage of 50 V was applied to this piezoelectric/electrostrictive element was measured with a displacement meter. As a result of the measurement, the displacement was 0.31 to 0.34 µm.

Comparative Example 1

Figure 3:
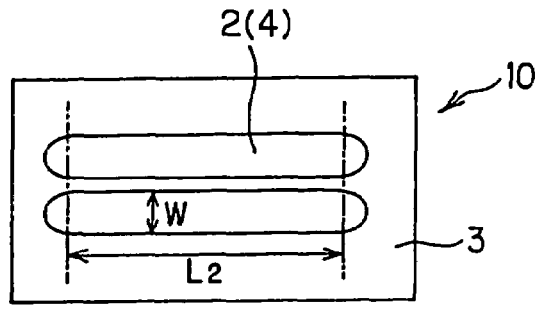
FIG. 3 is a top plan view schematically showing one embodiment of a conventional diaphragm structure.

A diaphragm structure was obtained in the same manner as in Example 1 described above except that dimensions and shapes of openings 2 were set to a shape (see FIG. 3) constituted of straight lines and semicircles and having a maximum opening width W=300 µm and a straight line portion length $L_2$=4200 µm.

Figure 4:
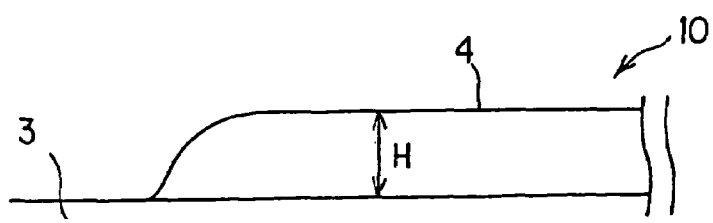
FIG. 4 is a partially enlarged sectional view schematically showing one embodiment of the conventional diaphragm structure.
Figure 5:
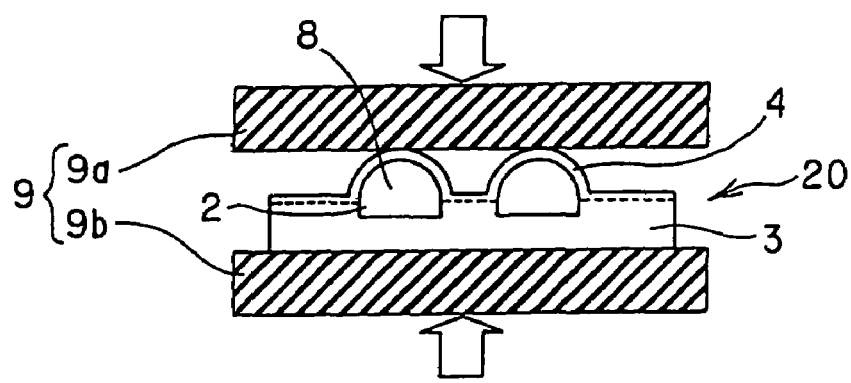
FIG. 5 is a sectional view schematically showing one example of a state in which the diaphragm structure is corrected.

When a three-dimensional shape of the diaphragm structure obtained using a laser scanning microscope was measured, a protruding height H (see FIG. 4) was 10.3 to 12.1 µm.

A loading thermal treatment was performed by a method similar to that of Example 1 described above. When the protruding height H (see FIG. 4) of each loaded and thermally treated diaphragm portion was measured with a contact type shape measurement device, the height was 8.9 to 9.9 µm. A red check penetrant was injected into each opening, and a cracking check of the diaphragm portion was conducted by confirmation of exuding onto the surface of the diaphragm portion. As a result of the check, cracks attributable to the loading thermal treatment only were generated in 81 out of 120 diaphragm portions.

After appropriately forming and firing a lower electrode, a piezoelectric/electrostrictive portion, and an upper electrode by a screen printing process on the surface of the diaphragm portion of the diaphragm structure subjected to the loading and heating treatment, a polarization treatment was performed to thereby prepare a piezoelectric/electrostrictive element (actuator). A displacement of the diaphragm portion in a case where a voltage of 50 V was applied to this piezoelectric/electrostrictive element was measured with a displacement meter. As a result of the measurement, the diaphragm portion which was not cracked had a displacement of 0.26 to 0.34 µm, and there were more fluctuations as compared with Example 1.

Examples 2 to 7

A diaphragm structure was obtained in the same manner as in example 1 described above except that the dimensions of opening 2 and diaphragm portion after firing are set as shown in table 1, and the firing temperature is 1470° C.

The obtained diaphragm structure is applied with loading and heating treatment in the same manner as in Example 1 described above except that mass of the alumina block used is 240 g. In example 2 to 7, the average value of the maximum protruding height $H_2$ of the diaphragm portion after loading and heating treatment is 9.0 to 9.1 µm with fluctuation 8% or less.

Comparative Example 2

A diaphragm structure was obtained in the same manner as in comparative example 1 described above except that the dimensions of opening 2 and diaphragm portion after firing are set as shown in table 1, and the firing temperature is 1470° C.

The obtained diaphragm structure is applied with loading and heating treatment in the same manner as in Example 1 described above except that mass of the alumina block used is 240 g. The average value of the maximum protruding height H of the diaphragm portion after loading and heating treatment is 9.0 μm with the fluctuation of 9% or less. In addition, the diaphragm structure of the comparative example 2 has fewer cracks than the diaphragm structure of the comparative example 1. This result is considered to be because of the load reduction in loading and heating treatment and the reduction of the maximum opening width W.

TABLE 1

|  | Thickness of the diaphragm portion (μm) | $L_1$(μm) | $(L_1/W) \times 100$ | $L_2$(μm) | W(μm) | D(μm) | $(D/W) \times 100$ (%) |
|---|---|---|---|---|---|---|---|
| example 2 | 4 | 105 | 50 | 1590 | 210 | 85 | 40 |
| example 3 | 4 | 105 | 50 | 1590 | 210 | 190 | 90 |
| example 4 | 4 | 85 | 40 | 1630 | 210 | 85 | 40 |
| example 5 | 4 | 85 | 40 | 1630 | 210 | 190 | 90 |
| example 6 | 4 | 32 | 15 | 1736 | 210 | 85 | 40 |
| example 7 | 4 | 32 | 15 | 1736 | 210 | 190 | 90 |
| comparative example 2 | 4 | — | — | 1800 | 210 | 210 | 100 |

(Counting/Evaluation of the Cracks)

The diaphragm structures of the example 2 to 7 and comparative example 2 were tested with cracks in the same manner as in example 1 after loading and heating treatment and counted for cracks generated on the diaphragm portion. The results of counting the cracks were shown in table 2 under the following criteria.

⊚: no crack
◯: 1 to 6 cracks
Δ: 7 to 12 cracks

TABLE 2

| | | $(D/W) \times 100$ (%) | | |
|---|---|---|---|---|
| | | 40 | 90 | 100 |
| $(L_1/W) \times 100$ (%) | 0 | | | Δ(comparative example 2) |
| | 15 | ◯(example 6) | ◯(example 7) | |
| | 40 | ◯(example 4) | ◯(example 5) | |
| | 50 | ⊚(example 2) | ⊚(example 3) | |

Example 8

Figure 12:
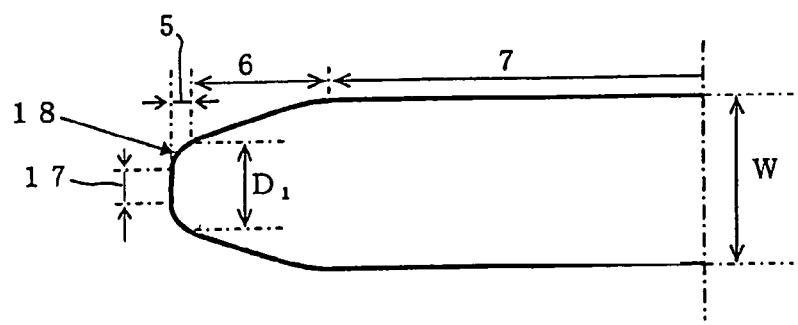
FIG. 12 is a schematic diagram showing a tip portion of the diaphragm structure in examples 8 and 9.

As shown in FIG. 12, a diaphragm structure was obtained in the same manner as in comparative example 2 except that the shape of the tip portion has 25 μm length straight line, with the width of 85 μm of the tip opening and the portion connected to the tapered portion is circular arc shape. The obtained diaphragm structure is applied with loading and heating treatment in the same manner as in Example 2. The average value of the maximum protruding height $H_2$ of the diaphragm portion after loading and heating treatment is 9.0 μm with the fluctuation of 8% or less. No crack generated on this diaphragm portion was counted. In addition, the symbol 17 in FIG. 12 indicates the straight line included in the tip portion.

Example 9

As shown in FIG. 12, a diaphragm structure was obtained in the same manner as in comparative example 3 except that the shape of the tip portion 5 has 130 μm length straight line, with the width of 190 μm of the tip opening and the portion connected to the tapered portion is circular arc shape. The obtained diaphragm structure is applied with loading and heating treatment in the same manner as in Example 3. The average value of the maximum protruding height $H_2$ of the diaphragm portion after loading and heating treatment is 8.9 μm with the fluctuation of 8% or less. No crack generated on this diaphragm portion was counted.

INDUSTRIAL APPLICABILITY

In a diaphragm structure of the present invention, defects such as minute cracks were not easily generated in a thin portion even in a case where heating and loading are performed in order to eliminate a warpage, a distortion or the like. In a case where the structure has a plurality of cavities, volumes of the respective cavities are uniform. Therefore, the structure is suitable as a substrate for constituting a piezoelectric/electrostrictive element whose displacement is required to be adjusted with high precision.

What is claimed is:

1. A diaphragm structure comprising:
    a ceramic substrate in which at least one opening is formed, and
    a thin diaphragm portion having a shape protruding on a side opposite to the opening and constituted of a ceramic integrally fired with the ceramic substrate in such a manner as to cover the opening;
    wherein an opening shape of the opening is a shape including at least one tip portion in a longitudinal direction having a curved shape, and a tapered portion whose opening width is gradually reduced toward the tip portion and which is constituted of a curve or a straight line, and
    a portion of the diaphragm portion corresponding to the tapered portion has such a shape that protruding height gradually lowers toward the tip portion.

2. The diaphragm structure according to claim 1, wherein a length of the tapered portion is 15% or more of a maximum opening width, and the curved shape of the tip portion is any one of a circular arc shape, a semicircular arc shape, an elliptic arc shape, and a curved shape having a straight line portion in a portion other than a portion connected to the tapered portion, and a diameter of the tip portion is in a range of 40 to 90% of the maximum opening width in a case where the curved shape of the tip portion is the circular arc shape.

3. The diaphragm structure according to claim 1, wherein a length of the tapered portion is 50% or more of a maximum opening width, and the curved shape of the tip portion is any one of a circular arc shape, a semicircular arc shape, an elliptic arc shape, and a curved shape having a straight line portion in a portion other than a portion connected to the tapered portion, and a diameter of the tip portion is in a range of 40 to 90% of the maximum opening width in a case where the curved shape of the tip portion is the circular arc shape.

* * * * *